United States Patent
Fork

(10) Patent No.: US 6,528,350 B2
(45) Date of Patent: Mar. 4, 2003

(54) METHOD FOR FABRICATING A METAL PLATED SPRING STRUCTURE

(75) Inventor: David Kirtland Fork, Los Altos, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/863,237

(22) Filed: May 21, 2001

(65) Prior Publication Data

US 2002/0173146 A1 Nov. 21, 2002

(51) Int. Cl.[7] .................. H01L 21/44; H01L 21/48; H01L 21/50
(52) U.S. Cl. ............. 438/117; 438/611; 438/666; 438/678; 438/754
(58) Field of Search ............. 438/117, 611–612, 438/652, 666, 669, 674, 678, 745, 754

(56) References Cited

U.S. PATENT DOCUMENTS

| 3,842,189 A |   | 10/1974 | Southgate |
| 3,952,404 A | * | 4/1976  | Matunami ............ 257/735 |
| 4,189,342 A | * | 2/1980  | Kock ................ 257/625 |
| 5,613,861 A |   | 3/1997  | Smith |
| 5,665,648 A | * | 9/1997  | Little ............... 438/117 |
| 5,848,685 A |   | 12/1998 | Smith et al. |
| 5,914,218 A |   | 6/1999  | Smith et al. |
| 5,944,537 A |   | 8/1999  | Smith et al. |
| 5,979,892 A |   | 11/1999 | Smith |
| 6,184,065 B1 |  | 2/2001  | Smith et al. |
| 6,184,699 B1 |  | 2/2001  | Smith et al. |
| 6,213,789 B1 |  | 4/2001  | Chua et al. |
| 6,290,510 B1 | * | 9/2001 | Fork et al. ............. 439/81 |

FOREIGN PATENT DOCUMENTS

WO    WO 01/48870 A2    7/2001

* cited by examiner

Primary Examiner—Amir Zarabian
Assistant Examiner—Jamie L. Brophy
(74) Attorney, Agent, or Firm—Bever, Hoffman & Harms, LLP; Patrick T. Bever

(57) ABSTRACT

Efficient methods are disclosed for fabricating metal plated spring structures in which the metal is plated onto the spring structure after release. A conductive release layer is deposited on a substrate and a spring metal layer is then formed thereon. A first mask is then used to form a spring metal finger, but etching is stopped before the release layer is entirely removed. A second mask is then deposited that defines a release window used to remove a portion of the release layer and release a free end of the spring metal finger. The second mask is also used to plate at least some portions of the free end of the finger and selected structures exposed through the second mask. Remaining portions of the release layer are utilized as electrodes during electroplating. The resulting spring structure includes plated metal on both upper and lower surfaces of the finger.

13 Claims, 3 Drawing Sheets

METHOD FOR FABRICATING A METAL PLATED SPRING STRUCTURE

FIELD OF THE INVENTION

This invention generally relates to stress-engineered metal films, and more particularly to photo lithographically patterned spring structures formed from stress-engineered metal films.

BACKGROUND OF THE INVENTION

Photo lithographically patterned spring structures have been developed, for example, to produce low cost probe cards, and to provide electrical connections between integrated circuits. A typical spring structure includes a spring metal finger having an anchor portion secured to a substrate, and a free portion initially formed on a pad of release material. The spring metal finger is formed from a stress-engineered metal film (i.e., a metal film fabricated such that its lower portions have a higher internal tensile stress than its upper portions), such that the spring metal finger bends away from the substrate when the release material is etched away. The internal stress gradient is produced in the spring metal by layering different metals having the desired stress characteristics, or using a single metal by altering the fabrication parameters. Such spring metal structures may be used in probe cards, for electrically bonding integrated circuits, circuit boards, and electrode arrays, and for producing other devices such as inductors, variable capacitors, and actuated mirrors. Examples of such spring structures are disclosed in U.S. Pat. No. 3,842,189 (Southgate) and U.S. Pat. No. 5,613,861 (Smith).

The present inventors believe that many, if not most, potential commercial applications of spring structures will require metal plating on the free (released) portion of the spring metal finger. In some of these applications, the present inventors believe the spring metal structures will also require metal plating on the anchored portion of the spring metal finger. Accordingly, what is needed is a cost effective method for fabricating spring structures from stress-engineered metal film that include plated metal on the spring metal fingers.

SUMMARY OF THE INVENTION

The present invention is directed to efficient methods for fabricating spring structures in which a plated metal layer is formed on spring metal fingers after release from an underlying substrate. By plating the spring metal finger after release (i.e. after the finger is allowed to bend upward from the substrate due to internal stress), plated metal is formed on both the upper and lower surfaces of the spring metal finger simultaneously, thereby producing a low-cost spring structure exhibiting superior stiffness, thickness and electrical conductivity when compared to non-plated spring structures, or to spring structures plated before release.

In accordance with the disclosed fabrication method, a conductive release layer is deposited on a substrate, and then a stress-engineered (spring) metal film is formed on the release material layer. A first mask is then used to etch an elongated spring metal island from the metal film, but etching is stopped before the release layer is entirely removed to prevent undercutting that can cause premature release of the spring metal island. A release (second) mask is then deposited that defines a release window exposing a portion of the spring metal island and the release material layer surrounding this exposed portion. Subsequent removal of the release material layer exposed by the release mask causes the exposed portion of the spring metal island to bend away from the substrate due to its internal stress, thereby becoming the free portion of a spring metal finger, which also includes an anchored portion covered by the release mask. The release mask is then used to perform metal plating during which a plated metal layer is formed on the free portion of the spring metal finger, along with other selected structures exposed through the release mask.

In one embodiment, the plated metal is formed using an inexpensive electroplating procedure in which a conductive release layer is utilized as a cathode, thereby providing a thick spring structure that is significantly less expensive than spring structures having comparable thicknesses entirely formed by sputtering.

In another embodiment, the release mask, which is also used during the plating process, is provided with a channel extending over the anchored (i.e., non-released) portion of the spring metal finger, thereby facilitating the formation of plated metal on the anchor portion to improve conductivity.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
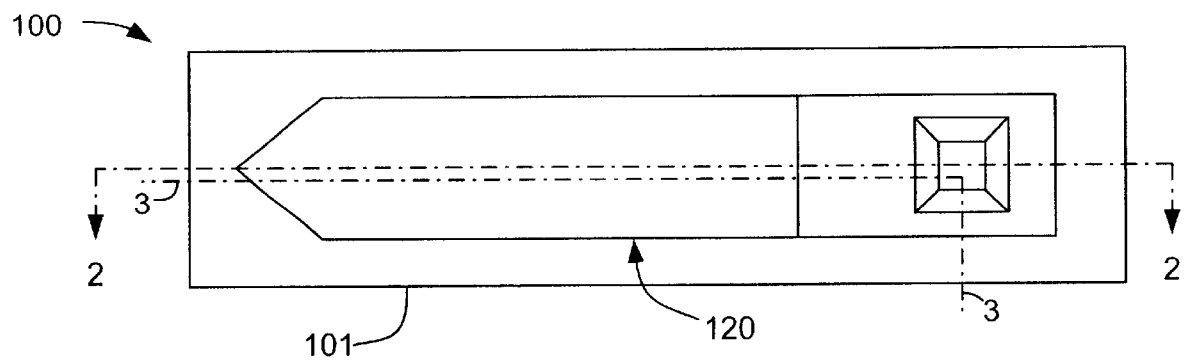
FIG. 1 is a plan view showing a spring structure according to a first embodiment of the present invention.
Figure 2:
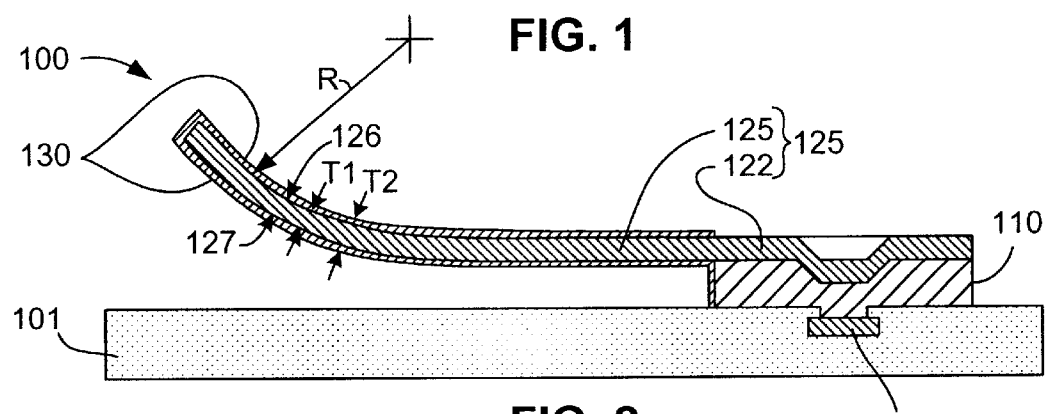
FIG. 2 is a cross-sectional side view of the spring structure taken along section line 2—2 of FIG. 1.
Figure 3:
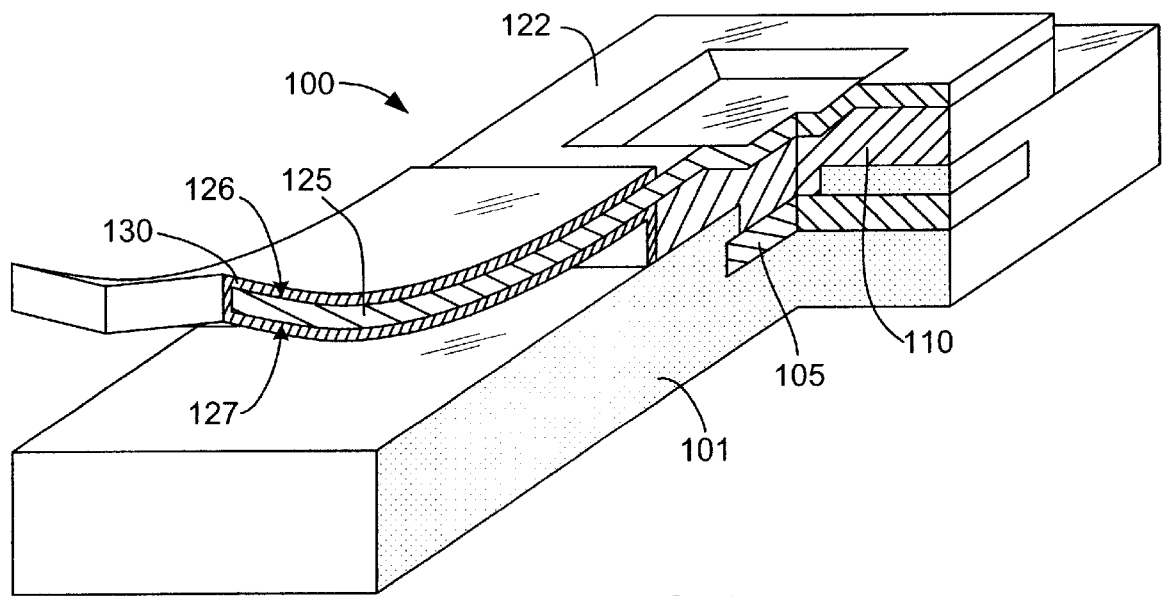
FIG. 3 is a cut-away perspective view of the spring structure shown in FIG. 1.

FIGS. 1, 2 and 3 show a spring structure 100 according to a first embodiment of the present invention. FIG. 1 is a plan view of spring structure 100, FIG. 2 is a cross-sectional side view taken along section line 2—2 of FIG. 1, and FIG. 3 is a perspective view with a cut-away section indicated by section line 3—3 in FIG. 1.

Spring structure 100 generally includes a substrate 101, a release material portion 110, and a spring metal finger 120. Substrate 101 (e.g., glass) includes an optional conductor 105 that can take several forms. For example, if substrate 101 includes an integrated circuit, conductor 105 may be a portion of the metallization that is exposed through an opening in a passivation layer, otherwise referred to as a via. In this case, conductor 105 may be electrically connected to electrical elements of the integrated circuit. Alternatively, if substrate 101 is printed circuit board, printed wiring board, silicon device, or interposer, then conductor 105 may be an exposed portion of conducting material that is electrically connected to redistribution traces through substrate vias, solder bumps, solder balls, mounted electrical components, integrated passive components, or interconnect pads. Release material portion 110 is formed on an upper of substrate 101 such that it contacts conductor 105 (if present). Spring metal finger 120 includes an anchor portion 122 and a free (i.e., cantilevered) portion 125. Anchor portion 122 is attached to release material portion 110 (i.e., such that release material portion 110 is located between anchor portion 122 and substrate 101). Free portion 125 extends from anchor portion 122 over substrate 101, and includes an upper (first) surface 126 and an opposing lower (second) surface 127 that define a thickness T1.

Similar to prior art spring structures, spring metal finger 120 is etched from a stress-engineered metal film that is formed by DC magnetron sputtering one or more metals using gas (e.g., Argon) pressure variations in the sputter environment during film growth in accordance with known techniques. By carefully selecting the metals and/or processing parameters, sputtered metal films can be used to form tightly curved spring metal fingers, or very stiff spring metal fingers, but not both simultaneously because increasing the film thickness (which is necessary to increase stiffness) also increases the radius of the resulting spring metal finger. Further, the internal stress of the stress-engineered metal film cannot be increased arbitrarily because of material limitations.

In accordance with an aspect of the present invention, a plated metal layer 130 (e.g., Nickel (Ni)) is formed on free portion 125 of spring metal finger 120 after free portion 125 is released (i.e., after release material located under free portion 125 is removed, thereby allowing internal stress to bend free portion 125 away from substrate 101). Because plated metal layer 130 is formed after free portion 125 is released, plated metal layer 130 is deposited on both upper surface 126 and lower surface 127 of free portion 125, thereby providing structural and electrical characteristics that are superior to spring structures that are formed without plated metal, or having plated metal formed only on one side. Several of the benefits provided by plated metal layer 130 are described in the following paragraphs.

First, forming plated metal layer 130 after release allows spring structure 100 to be relatively thick (and, therefore, stiff), thereby increasing the spring force constant of spring structure 100 at a lower cost than un-plated spring structures, or spring structures having plated metal formed only on one side. As indicated in FIG. 2, the plating process increases a total thickness T2 of free portion 125 over thickness T1 by twice the thickness of plated metal layer 130. It is well established that increasing thickness by metal plating is significantly less expensive than by sputtering. Therefore, spring structure 100 is significantly less expensive to produce than an un-plated spring structure having the same thickness. Further, plated metal layer 130 forms on both upper surface 126 and lower surface 127 simultaneously, thereby reducing the required plating period (and, hence, manufacturing costs) when compared to pre-release plating methods. Moreover, as described below, plated metal layer 130 is formed at very low cost because the basic two-mask process utilized for making un-plated spring structures is not violated (i.e., no additional masks are used to perform the plating process).

Second, forming plated metal layer 130 after release allows spring structure 100 to be both tightly curved and relatively thick (and, therefore, stiff) at a lower cost than un-plated spring structures, or spring structures having plated metal formed only on one side. As indicated in FIG. 2 and discussed above, the curvature R of free portion 125 is partially determined by the thickness T1 of the stress-engineered metal film from which it is etched. In order to generate a tightly curved spring structure, a relatively thin metal film is required. According to the present invention, spring structure 100 can be both tightly curved and relatively thick by forming spring metal finger 120 from a thin stress-engineered metal film, and then forming a relatively thick of plated metal layer 130.

Third, forming plated metal 130 on both upper surface 126 and lower surface 127 increases the conductivity of spring metal finger 120, when compared to spring structures without plated metal or having plated metal formed only on one side. Due to the fabrication processes typically used to form the stress-engineered metal film (e.g., sputtering), these metal films are inherently poor electrical conductors. Therefore, in applications requiring high conductivity, plated metal layer 130 may be added to increase the total electrical conductivity of spring structure 100.

Plated metal layer 130 provides several other potentially important benefits. For example, plated metal layer 130 may be used to electroform the closure of mechanically contacted elements (e.g., an out-of-plane inductor formed using a series of spring metal fingers bent such that the free end of each spring metal finger contacts the anchor portion of an adjacent spring metal finger). Plated metal layer 130 may also be used to passivate spring metal finger 120, which is important because most springy metals, such as stress-engineered metal film 210, form surface oxides. Plated metal layer 130 may also be added to increase wear resistance and lubricity. Plated metal layer 130 may also be added to resist delamination of free portion 125 of spring metal finger 120 by balancing the peeling tendency of the stress gradient in the stress-engineered metal film. Plated metal layer 130 can also provide a compression stop to limit spring compression. Moreover, plated metal layer 130 may be added to strengthen spring structure 100 by adding ductility. Finally, plated metal layer 130 may be added to blunt the radii of process features and defects that can arise on spring metal finger 120. The above-mentioned benefits are not intended to be exhaustive.

Note that optional conductor 105 is included to provide electrical coupling of spring structure 100 to an external electrical system (not shown). Note also that the electrical coupling between spring metal finger 120 and conductor 105 necessitates using an electrically conductive release material to form release material portion 110. However, electrical coupling can also be provided directly to spring metal finger 120 by other structures (e.g., wire bonding), thereby allowing the use of non-conducting release materials. Further, the cost-to-thickness (stiffness) characteristics discussed above may also be beneficially exploited in applications in which spring metal finger 120 is not used to conduct electric signals.

FIGS. 4(A) through 4(I) and FIGS. 5(A) and 5(B) illustrate a method for fabricating spring structure 100 (described above).

Figure 4A:
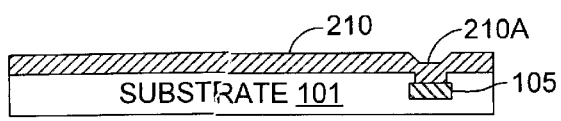
FIGS. 4(A) through 4(J) are cross-sectional side views showing fabrication steps associated with the production of the spring structure shown in FIG. 1.

Referring to FIG. 4(A), the fabrication method begins with the formation of a conductive release material layer 210 over a glass (silicon) substrate 101. When electroplating is utilized (see step described below), release material layer 210 is formed from an electrically conductive material, and a portion 210A of release material layer 210 contacts conductor 105 that is exposed on the upper surface of substrate 101. In one embodiment, release material layer 210 is Titanium (Ti) that is sputter deposited onto substrate 210 to a thickness of approximately 0.2 microns or greater. Titanium provides desirable characteristics as a conductive release material layer due to its plasticity (i.e., its resistance to cracking) and its strong adhesion. Other release materials having the beneficial plastic characteristics of titanium may also be used. In other embodiments, release material Layer 210 includes another metal, such as Copper (Cu), Aluminum (Al), Nickel (Ni), Zirconium (Zr), or Cobalt (Co). Release material layer 210 may also be formed using heavily doped silicon (Si). Further, two or more release material layers can be sequentially deposited to form a multi-layer structure. In yet another possible embodiment, any of the above-mentioned release materials can be sandwiched between two non-release material layers (i.e., materials that are not removed during the spring metal release process, described below). Note that when an electroless plating process is utilized, the release material layer 210 can be a non-conducting material, such as Silicon Nitride (SiN).

Figure 4B:

FIG. 4(B) shows a stress-engineered metal film 220 formed on release material layer 210 using known processing techniques such that it includes internal stress variations in the growth direction. For example, in one embodiment, stress-engineered metal film 220 is formed such that its lowermost portions (i.e., adjacent to release material layer 210) has a higher internal tensile stress than its upper portions, thereby causing stress-engineered metal film 220 to have internal stress variations that cause a spring metal finger to bend upward away from substrate 201 (discussed below). Methods for generating such internal stress variations in stress-engineered metal film 220 are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, which utilizes a 0.2 micron Ti release material layer, stress-engineered metal film 220 includes Molybdenum and Chromium (MoCr) sputter deposited to a thickness of 1 micron. In other embodiments, a Mo spring metal layer can be formed on SiN release material layers.

Note that when conductive release material is used, stress-engineered metal film 220 is separated from contact pad 105 by portion 210A of release material layer 210. Accordingly, a separate masking step utilized in conventional fabrication methods to form an opening in the release material is not required, thereby reducing fabrication costs. Instead, as discussed below, the present embodiment utilizes the conductivity of release material layer 210 to provide electrical connection between contact pad 105 and stress-engineered metal film 220.

Note also that an optional passivation metal layer (not shown) may be deposited on the upper surface of stress-engineered metal film 220 at this stage of the fabrication process. Such a passivation metal layer (e.g., Au, Pt, Pd, or Rh) is provided as a seed material for the subsequent plating process if stress-engineered metal film 220 does not serve as a good base metal. The passivation metal layer may also be provided to improve contact resistance in the completed spring structure.

Figure 4C:
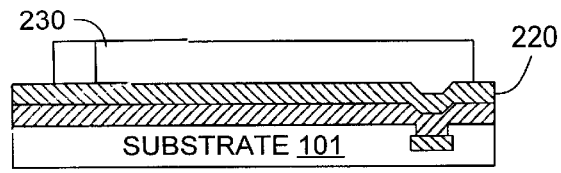
Figure 5A:
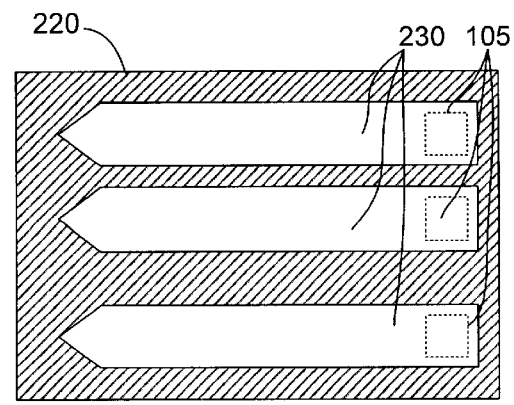
FIGS. 5(A) and 5(B) are plan views showing the spring structure of FIG. 1 during selected fabrication steps.

Referring to FIGS. 4(C) and 5(A), elongated spring metal (first) masks 230 (e.g., photoresist) are then patterned over a selected portion of stress-engineered metal film 220. Note that each spring metal mask 230 extends over an associated contact pad 105 (if present), as shown in FIG. 5(A).

Figure 4D:
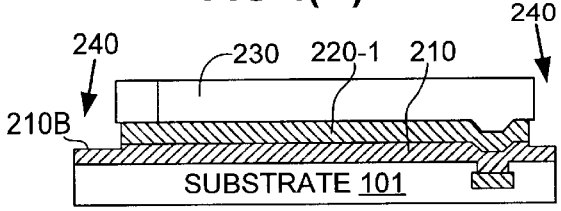

Next, as indicated in FIG. 4(D), exposed portions of stress-engineered metal film 220 surrounding the spring metal mask 230 are etched using one or more etchants 240 to form a spring metal island 220-1. Note that this etching process is performed such that limited etching is performed in portions 210B of release layer 210 that surround spring metal island 220-1 such that at least a partial thickness of release layer portion 210B remains on substrate 101 after this etching step. In one embodiment, the etching step may be performed using, for example, a wet etching process to remove exposed portions of stress-engineered metal film 220. This embodiment was successfully performed using cerric ammonium nitrate solution to remove a MoCr spring metal layer. In another embodiment, anisotropic dry etching is used to etch both stress-engineered metal film 220 and the upper surface of release layer portion 210B. This embodiment may be performed, for example, with Mo spring metal, and Si or Ti release layers. Mo, Si and Ti all etch in reactive fluorine plasmas. An advantage of dry etching the spring metal film is that it facilitates finer features and sharper tipped spring metal fingers. Materials that do not etch in reactive plasmas may still be etched anisotropically by physical ion etching methods, such as Argon ion milling. In yet another possible embodiment, the etching step can be performed using the electrochemical etching process described in IBM J. Res. Dev. Vol. 42, No. 5, page 655 (September 5, 1998), which is incorporated herein by reference. Many additional process variations and material substitutions are therefore possible and the examples given are not intended to be limiting.

Figure 4E:
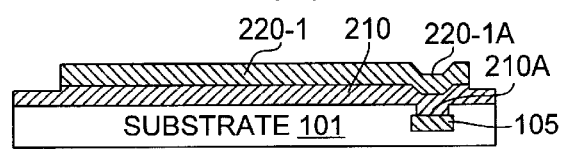

FIG. 4(E) shows spring metal island 220-1 and release material 210 after spring metal mask 230 (FIG. 4(D)) is removed. Note again that electrical connection between contact pad 105 and spring metal island 220-1 is provided through portion 210A of release material layer 210.

Figure 4F:
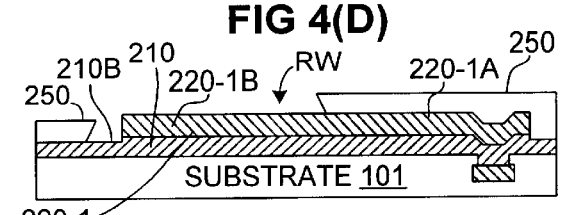

Referring to FIG. 4(F), release (second) mask 250 (e.g., photoresist) is then formed on a first portion 220-1A of spring metal island 220-1. Release mask 250 defines a release window RW, which exposes a second portion 220-1B of spring metal island 220-1 and surrounding portions 210B of release material layer 210.

Figure 4G:
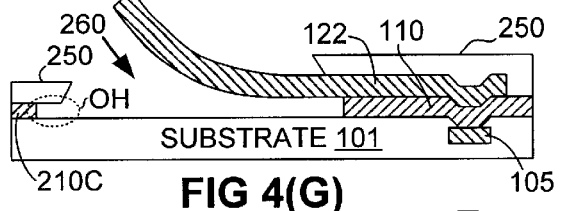

Referring to FIG. 4(G), a release etchant 260 (e.g., a buffered oxide etch) is then use to selectively remove a portion of the release material layer from beneath the exposed portion of the spring metal island to form spring metal finger 120 (discussed above with reference to FIGS. 1–3). Specifically, removal of the exposed release material causes free portion 125 to bend away from substrate 101 due to the internal stress variations established during the formation of the spring metal film (discussed above). Note that anchor portion 122 remains secured to substrate 101 by release material portion 110, which are protected by release mask 250. Note also that when release material portion 110 is formed from a conductive release material, the resulting spring structure is electrically coupled to contact pad 105.

Note that in region OH (FIG. 4(G)) the undercut edge of release mask 250 overhangs remaining portions 210C of the release material layer. During subsequent metal plating (discussed below), metal can become plated in overhang region OH under the overhanging mask structure. This is a potential problem as it could lead to shorted structures caused by bridging strips of plated metal that become separated from the edges of the release window when the release window is subsequently stripped.

Figure 4H:
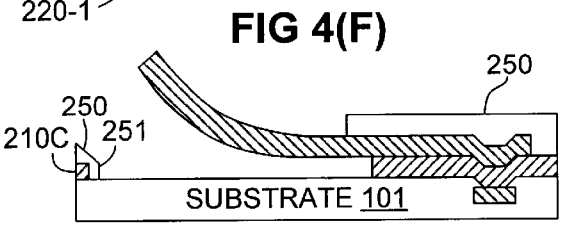
Figure 5B:
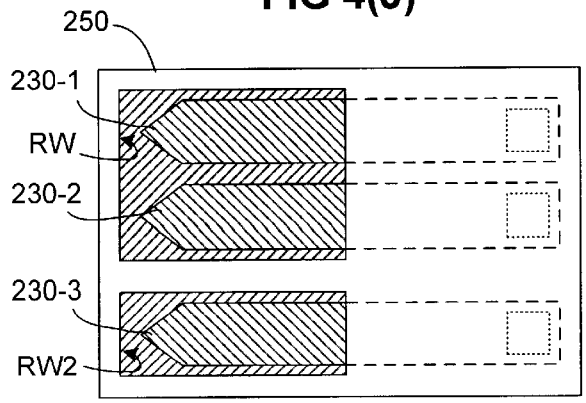

FIGS. 4(H) and 5(B) depict optional steps for avoiding the bridging strips of plated metal that can become plated along the edge of release mask 250. First, as indicated in FIG. 4(H), a reflow process that may be performed in which the temperature of release mask 250 is raised above its glass transition temperature or melting point in order to collapse the edge 251 of release window 250 to close off the overhanging resist. Closing off this overhanging resist will prevent the plating solution from forming potentially bridging strips. A modest amount of over etch, if needed, during the release process will produce the overhanging resist such that release mask 250 will flow to close off the edge of release layer portion 210C. The inventors have observed that during reflow, capillary forces in the liquefied release window material cause it wet to and stick to the substrate, thereby closing off the gap produced by the undercut. Referring to the upper portion of FIG. 5(B), eliminating the overhang facilitates relatively closely spaced spring structures because it allows more than one spring metal island (i.e., 220-1 and 220-2) to be exposed through a single release window RW. However, as indicated in the lower portion of FIG. 5(B), a second approach avoids the reflow step entirely by forming a separate release window RW2 for each spring metal island 220-3, thereby preventing bridging strips from contacting more than one spring structure. Note that separate release window RW2 requires a relatively wide spacing between spring metal islands, thereby resulting in relatively widely spaced spring structures.

In accordance with another aspect of the present invention, metal plating is applied to the released spring metal finger using the release mask and remaining portions of the release metal layer (i.e., those portions that are not etched away during the release operation, discussed above).

Metal plating can be performed through the release mask using either electroless plating techniques or electroplating techniques. However, electroplating is preferred due to simplicity, cost, and material quality. The spring metal finger component may be thought of as a scaffold or skeleton upon which additional material is added by plating. The high-cost component (sputtered metal) is minimized and augmented by the low-cost batch material (plated metal). Accordingly, metal plating provides a relatively thin spring metal finger provides a substantially less expensive method of achieving a thick, stiff spring structure than sputtering alone. The release window is used as the plating mask to plate metal onto the exposed metal including the release springs, and depending on design, other exposed metal.

Figure 4I:
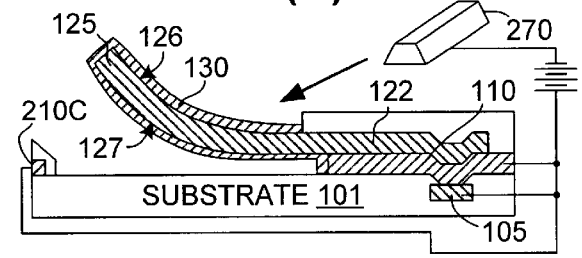

As indicated in FIG. 4(I), in one embodiment release material portion 110 (which is located under anchored portion 220-1A) and remaining portions 210C (which are located under release material mask after the release operation) can be utilized to facilitate electroplating by providing a suitable common electrical path for the electroplating cathode. In one embodiment, electroplating is performed, for example, using a metal source 270 (e.g., Ni, Au, Cu, Pd, Sn solder, Rh and/or alloys thereof) and known parameters. More than one of these metals may be plated in succession (e.g., Ni for stiffness followed by Au for passivation). The electrical (cathode) connection can be made directly to these remaining release layer portions, through conductor 105, or through spring metal 220 or its optimal passivation metal (not shown). On a typical wafer containing many devices to be plated, current can be supplied to all of the devices through a small number of contacts located at the periphery of the wafer. After the release operation, these release material portions are still connected without isolated islands, although they do have many openings beneath free portions 125. These release layer portions therefore provide a suitable conducting contact for the electroplating cathode.

Figure 4J:
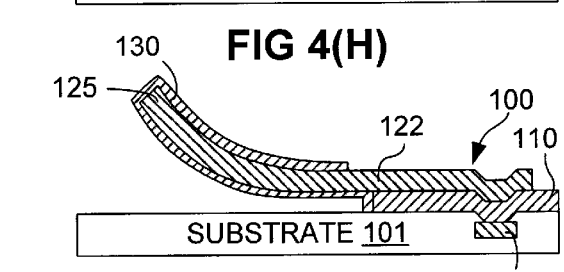

FIG. 4(J) shows spring structure 100 after release mask 250 and remaining portions 210C of the release layer (see FIG. 4(I)) are removed using known techniques.

Figure 6:
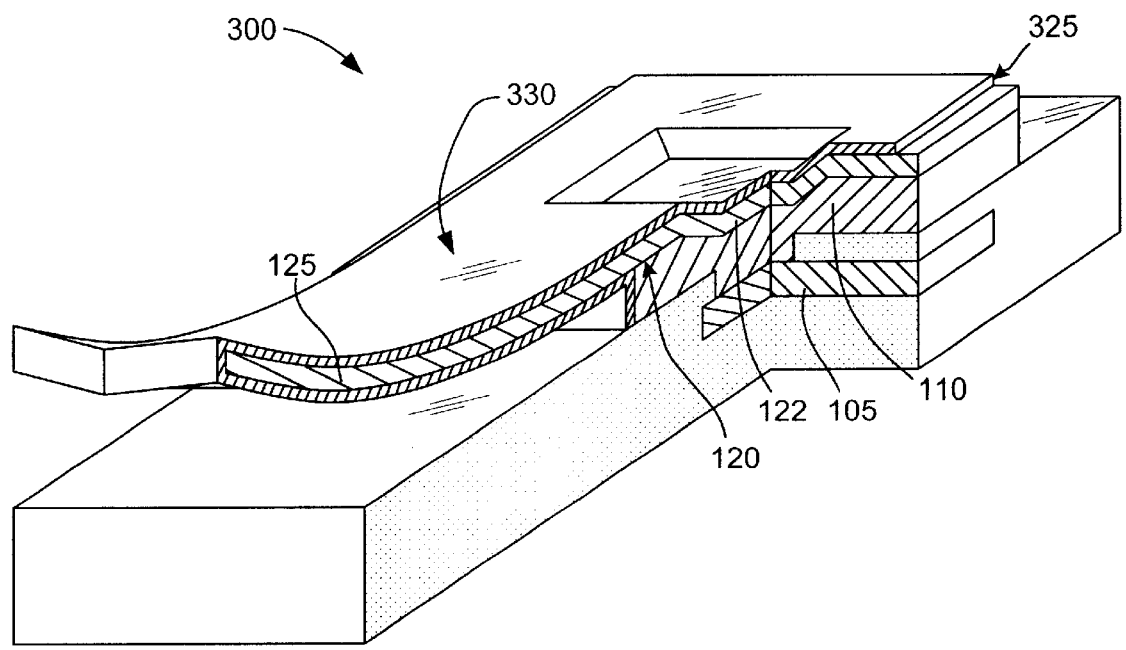
FIG. 6 is a cut-away perspective view showing a spring structure according to a second embodiment of the present invention.

FIG. 6 shows a spring structure 300 according to a second embodiment of the present invention. Similar to spring structure 100 (discussed above), spring structure 300 includes a release layer portion 110 formed to contact a conductor 105, a spring metal finger 120 formed on release layer portion 110, and a plated metal layer 330 formed on spring metal finger 120. However, spring structure 300 differs from spring structure 100 in that plated metal layer 330 is formed on both free portion 125 and anchored portion 122 of spring metal finger 120 (referring to FIG. 3, plated metal layer 130 only covers free portion 125). Specifically, plated metal layer 330 is formed on both sides of free portion 125, as described above, and is also formed on an upper surface of anchored portion 122. As mentioned above; it is well established that resilient springy metals such as MoCr exhibit relatively high resistance in comparison to many forms of plated metal, such as Ni, Au and Cu. Accordingly, by extending plated metal layer 330 over anchored portion 122, currents passing between free portion 125 and conductor 105 are subjected to less resistance than in spring structure 100 due to the presence of plated metal layer 330 on anchor portion 122.

Figure 7:
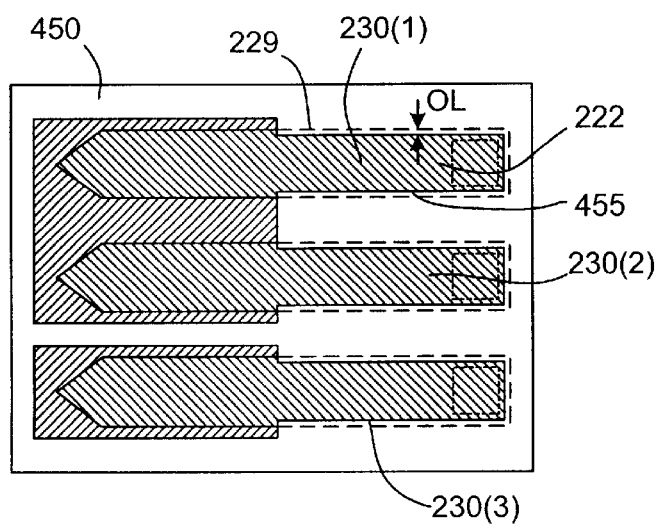
FIG. 7 is a plan view showing a release mask utilized to fabrication the spring structure shown in FIG. 6.

FIG. 7 is a plan view showing a release mask 450 utilized in the fabrication of spring structure 300 (FIG. 6). Release mask 450 is similar to release mask 250 (shown in FIG. 5(B)), except that the release window defined by release mask 450 exposes part of the anchored portion of each spring metal island 230(1) through 230(3). For example, referring to spring metal island 230(1), release window 450 includes a channel 455 that extends over anchored portion 222. Note that channel 455 overlaps the outer edge 229 of anchor portion 222 by an overlap width OL of 1 to 10 microns to prevent unintended release of anchor portion 222. Referring briefly to FIG. 6, is overlap produces a step structure shoulder 325 extending along the edge of anchor portion 222.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A method for fabricating a spring structure on a substrate, the method comprising:

forming a spring metal island on a release material layer, wherein the spring metal island has internal stress variations in the growth direction;

selectively removing a first portion of the release material layer from beneath a free portion of the spring metal island using a release mask that covers an anchor portion of the spring metal island and a retained portion of the release material layer, where upon removing the first portion of the release material layer, the internal stress variations cause the free portion of the spring metal island to bend relative to the substrate, thereby forming a spring metal finger such that the anchor portion is attached to the retained portion of the release material layer; and forming a plated metal layer on the free portion of the spring metal finger.

2. The method according to claim 1, wherein forming the plated metal layer further comprises reflowing the release mask.

3. The method according to claim 1, wherein forming the plated metal layer comprises electroless plating.

4. The method according to claim 1, wherein forming the plated metal layer comprises electroplating.

5. The method according to claim 4, wherein electroplating comprises coupling a cathode to second portions of the release material layer.

6. The method according to claim 1, wherein forming a spring metal island:

forming the release material layer using an electrically conducting material;

forming a stress-engineered metal film on the release material layer;

forming a first mask over an elongated region of the stress-engineered metal film; and etching exposed portions of the stress-engineered metal film.

7. The method according to claim 6, wherein selectively removing a first portion of the release material layer further comprises forming the release mask to define a release window exposing the first portion of the release material layer and the free portion of the spring metal island, and wherein the plated metal layer is formed on the free portion of the spring metal finger before the release mask is removed.

8. The method according to claim 7, wherein forming the release mask further comprises defining a channel exposing the anchor portion of the spring metal island such that an edge of the anchor portion is covered by the release mask to prevent release of the anchor portion.

9. The method according to claim 8, wherein the plated metal layer includes a portion formed on the anchor portion.

10. A method for fabricating a spring structure on a substrate, the method comprising:

etching a spring metal island from a stress-engineered metal film using a first mask, wherein the spring metal island is formed on a release material layer;

removing the first mask;

forming a second mask over a first portion of the spring metal island, wherein a second portion of the spring metal island is exposed through a window formed in the second mask;

selectively removing a first portion of the release material layer from beneath the second portion of the spring metal island, where upon removing the first portion of the release material layer, the internal stress variations cause the second portion of the spring metal island to bend relative to the substrate, thereby forming a spring metal finger having an anchor portion formed on a second portion of the release material layer; and forming a plated metal layer on the bent portion of the spring metal finger; and removing the second mask.

11. The method according to claim 10, wherein forming the plated metal layer further comprises reflowing the second mask before forming the plated metal layer.

12. The method according to claim 10, wherein forming the second mask further comprises defining a channel exposing an upper surface of the first portion of the spring metal island such that an edge of the first portion is covered by the second mask to prevent release of the first portion.

13. The method according to claim 11, wherein forming the plated metal layer includes forming a portion on the first portion of the spring metal finger.

* * * * *

UNITED STATES PATENT AND TRADEMARK OFFICE
CERTIFICATE OF CORRECTION

| | | |
|---|---|---|
| PATENT NO. | : 6,528,350 B2 | Page 1 of 1 |
| APPLICATION NO. | : 09/863237 | |
| DATED | : March 4, 2003 | |
| INVENTOR(S) | : David K Fork | |

It is certified that error appears in the above-identified patent and that said Letters Patent is hereby corrected as shown below:

Column 1, line 4, insert as a new paragraph:

This invention was made with Government support under 70NANB8H4008 awarded by NIST. The Government has certain rights in this invention.

Signed and Sealed this

Seventeenth Day of April, 2007

JON W. DUDAS
*Director of the United States Patent and Trademark Office*